United States Patent
Hellberg

(10) Patent No.: US 9,432,060 B2
(45) Date of Patent: Aug. 30, 2016

(54) APPARATUS AND METHOD FOR LOAD MODULATING AN AMPLIFIER

(71) Applicant: Telefonaktiebolaget L M Ericsson (publ), Stockholm (SE)

(72) Inventor: Richard Hellberg, Huddinge (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 14/436,651

(22) PCT Filed: Oct. 19, 2012

(86) PCT No.: PCT/EP2012/070758
§ 371 (c)(1),
(2) Date: Apr. 17, 2015

(87) PCT Pub. No.: WO2014/060044
PCT Pub. Date: Apr. 24, 2014

(65) Prior Publication Data
US 2015/0341059 A1 Nov. 26, 2015

(51) Int. Cl.
*H04B 1/04* (2006.01)
*H04B 1/00* (2006.01)
(Continued)

(52) U.S. Cl.
CPC ............... *H04B 1/04* (2013.01); *H03F 1/565* (2013.01); *H03F 3/193* (2013.01); *H03F 3/195* (2013.01);
(Continued)

(58) Field of Classification Search
CPC ........................................................ H04B 1/04
USPC ........................................................ 455/120
See application file for complete search history.

(56) References Cited

U.S. PATENT DOCUMENTS 6,317,608 B1 * 11/2001 Glocker ................ H04B 1/005 330/126
6,751,470 B1 * 6/2004 Ella ........................ H04B 1/005 455/188.1

(Continued)

FOREIGN PATENT DOCUMENTS

EP 1916772 A1 4/2008
WO 2009046228 A1 4/2009

OTHER PUBLICATIONS

Dome, R. B., "High-Efficiency Modulation System", Proceedings of the Institute of Radio Engineers, vol. 26, No. 8, Aug. 1938, 963-982.

(Continued)

*Primary Examiner* — Sanh Phu
(74) *Attorney, Agent, or Firm* — Patent Portfolio Builders, PLLC

(57) ABSTRACT

An apparatus is provided for load modulating a power amplifier that is configured to output a multiband radio frequency signal comprising at least a first frequency band and a second frequency band. The apparatus comprises a multiplexer (31) coupled to receive a multiband radio frequency signal from the output of a power amplifier, and configured to separate the multiband radio frequency signal into first and second frequency band signals. A first load modulator circuit (33$i$) is provided in a first branch, the first load modulator circuit coupled to receive the first frequency band signal, and configured to load modulate the first frequency band signal. A second load modulator circuit (33$2$) is provided in a second branch, the second load modulator circuit coupled to receive the second frequency band signal, and configured to load modulate the second frequency band signal.

16 Claims, 11 Drawing Sheets

(51) Int. Cl.
  *H03F 1/56*  (2006.01)
  *H03F 3/193* (2006.01)
  *H03F 3/195* (2006.01)
  *H03F 3/24*  (2006.01)
  *H03F 3/68*  (2006.01)
(52) U.S. Cl.
  CPC ............... *H03F 3/245* (2013.01); *H03F 3/68* (2013.01); *H04B 1/0057* (2013.01); *H03F 2200/111* (2013.01); *H03F 2200/378* (2013.01); *H03F 2200/387* (2013.01); *H03F 2200/391* (2013.01); *H04B 2001/0408* (2013.01)

(56) References Cited

U.S. PATENT DOCUMENTS 7,656,228 B2 * 2/2010 Fukuda ................ H03F 1/0288 330/126

9,143,172 B2 * 9/2015 See ........................ H03F 1/565

OTHER PUBLICATIONS

Nemati, Hossein M. et al., "Design of Varactor-Based Tunable Matching Networks for Dynamic Load Modulation of High Power Amplifiers", IEEE Transactions on Microwave Theory and Techniques, vol. 57, No. 5, May 2009, 1110-1118.

Parker, William N., "A Unique Method of Modulation for High-Fidelity Television Transmitters", Proceedings of the Institute of Radio Engineers, vol. 26, No. 8, Aug. 1938, 946-962.

Raab, Frederick H., "High-Efficiency Linear Amplification by Dynamic Load Modulation", IEEE MTT-S Digest, TH6B-1, 2003, 1717-1720.

Roder, Hans, "Analysis of Load-Impedance Modulation", Proceedings of the I.R.E., Jun. 1939, 386-395.

Unknown, Author, "A Question of Balance", Electronics World + Wireless World, vol. 101, No. 1707, Feb. 1995, 142-144.

* cited by examiner

Figure 11a 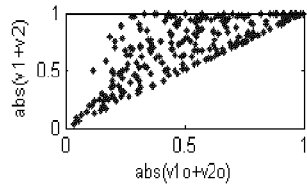 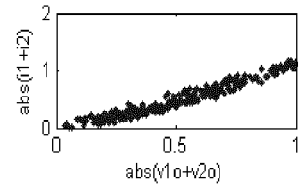 Figure 11b
Figure 11c 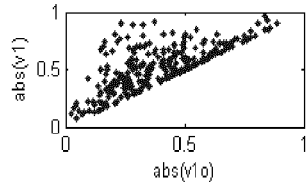 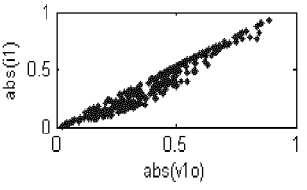 Figure 11d
Figure 11e 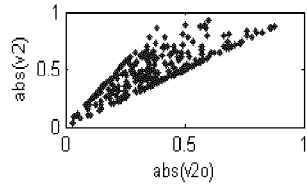 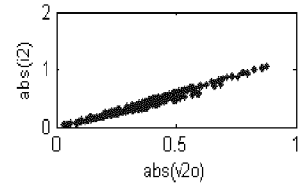 Figure 11f

APPARATUS AND METHOD FOR LOAD MODULATING AN AMPLIFIER

FIELD

The present invention relates to an apparatus and method for load modulating an amplifier, and in particular to an apparatus and method for load modulating a power amplifier that is configured to output a multiband radio frequency signal comprising at least a first frequency and a second frequency.

BACKGROUND

A conventional power amplifier (for example a class B, AB, F power amplifier) has a fixed RF load resistance and a fixed voltage supply. Class B or AB bias causes the output current to have a form close to that of a pulse train of half wave rectified sinusoid current pulses. The direct current (DC) and hence DC power is therefore largely proportional to the RF output current amplitude (and voltage). The output power, however, is proportional to the RF output current squared. The efficiency, i.e. output power divided by DC power, is therefore also proportional to the output amplitude. The average efficiency is consequently low when amplifying signals that on average have a low output amplitude (or power) compared to the maximum required output amplitude (or power).

One method for obtaining a high average efficiency from a power amplifier is called load modulation (LM), also known as dynamic load matching, for example as discussed in a paper by F. H. Raab entitled "High-Efficiency Linear Amplification by Dynamic Load Modulation," 2003 IEEE MTT-S Digest. Dynamic load matching is a method that, by continuous re-matching of an output matching network, makes the apparent load resistance at the output of the power amplifier higher for low amplitudes. This means that for a specific output amplitude (below maximum), less RF current will be used than in the conventional constant load, constant supply voltage system described above. Such a system is shown in FIG. 1, whereby the power amplifier 1 receives an RF input signal 3, the output 5 of the power amplifier 1 being coupled to a tunable matching network 7 which under control of a control signal 9 dynamically matches the load to produce an RF output signal 11. Due to such re-matching of the load using the tuneable matching network 7, the RF voltage rises, possibly up to the limit set by the usually constant supply voltage. This is illustrated in FIGS. 2a and 2b, FIG. 2a showing the relationship between voltage and output amplitude, and FIG. 2b the relationship between current and output amplitude.

Operating a single radio frequency power amplifier at two widely separated frequency bands simultaneously can have the benefit of reducing the cost of a basestation or similar equipment, since the output power capability of the power amplifier could be shared between bands. This is sometimes called (power) pooling. This way, if all users are in one of the bands, all output power can be used for those users; if there are users in several bands, the output power capability can be divided between bands as appropriate. Multiband operation and power pooling do not generally cause any problems (above common engineering skills) in conventional power amplifiers.

However, it is difficult providing a load modulated power amplifier that can work with high average efficiency for simultaneous signals in widely separated frequency bands, since dynamic modulated matching networks are in practice quite narrowband in nature. The possibility of modulating to a wide range of apparent load impedances causes a narrow pass-band response in the matching network. The pass-band width of a matching network can generally be increased by using more matching stages and consequently more (in this case both tunable and fixed) components. This has the disadvantage of increasing the cost of such systems.

A further disadvantage of such systems is their inability to handle multiband signals with widely separated bands, due to the high speed at which the multiband signal varies. In particular, it is difficult for the tuneable reactive components in the matching network to be re-tuned at such high speed. This has potentially two bad consequences. First, a wideband matching network with multiple stages is electrically long which means that, at any point in time, it will contain up to several RF cycles worth of RF energy. The usual quasi-static conditions for passive matching then no longer apply, and speedy re-tuning causes parametric intermodulation and partially incoherent (time-mismatched) reflections. Second, re-tuning the reactive components (typically varactors) generally has a power cost proportional to the tuning speed (bandwidth) squared (i.e. proportional to both slew rate and repetition rate). As a result, for wide band separation the high tuning speed can reduce efficiency quite substantially.

SUMMARY

It is an aim of the present invention to provide a method and apparatus which obviate or reduce at least one or more of the disadvantages mentioned above.

According to a first aspect of the invention there is provided an apparatus for load modulating a power amplifier that is configured to output a multiband radio frequency signal comprising at least a first frequency band and a second frequency band. The apparatus comprises a multiplexer coupled to receive a multiband radio frequency signal from the output of a power amplifier, and configured to separate the multiband radio frequency signal into at least first and second frequency band signals. A first load modulator circuit is provided in a first branch, the first load modulator circuit coupled to receive the first frequency band signal, and configured to load modulate the first frequency band signal. A second load modulator circuit is provided in a second branch, the second load modulator circuit coupled to receive the second frequency band signal, and configured to load modulate the second frequency band signal.

By providing a separate load modulator circuit for each band, this has the advantage of making it possible to simultaneously load-modulate a power amplifier with multiband signals with an arbitrarily large band separation. This also has the consequential advantage of enabling each load modulator, per se, to be simplified (i.e. compared with a single load modulator dealing with wide ranging frequency bands).

According to another aspect of the invention, there is provided a method for load modulating a power amplifier that is configured to output a multiband radio frequency signal comprising at least a first frequency band and a second frequency band. The method comprises the steps of receiving a multiband radio frequency signal from the output of a power amplifier, and separating the multiband radio frequency signal into at least first and second frequency band signals. The first frequency band signal is load modulated using a first load modulator circuit, and the second frequency band load modulated using a second load modulator circuit.

BRIEF DESCRIPTION OF THE DRAWINGS

For a better understanding of the present invention, and to show more clearly how it may be carried into effect, reference will now be made, by way of example only, to the following drawings in which:

FIG. 10b shows an example of the equivalent parallel resistor due to the lossy capacitance of FIG. 10a;

FIGS. 11a to 11f show the voltage and current relationships in a dual band modulator amplifier;

DETAILED DESCRIPTION

The embodiments below will be described in relation to a multiband signal comprising first and second radio frequency bands, that is, in the form of a dual band system. It is noted, however, that the invention is not limited to an apparatus and method for use with a multiband signal having just first and second radio frequency bands, but is intended to embrace any number of frequency bands in the multiband signal.

Figure 3:
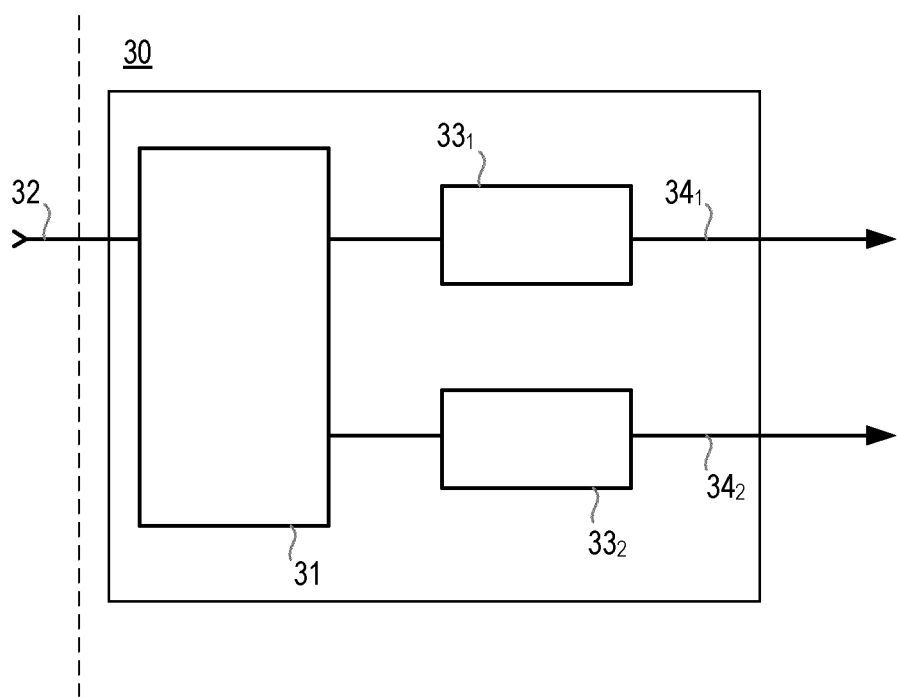
FIG. 3 shows an apparatus for load modulating a power amplifier according to an embodiment of the invention.

FIG. 3 shows an apparatus 30 according to a first embodiment of the invention, for load modulating a power amplifier (not shown) that is configured to output a multiband radio frequency signal comprising at least a first frequency band and a second frequency band. The apparatus 30 comprises a multiplexer 31 coupled to receive a multiband radio frequency signal 32 from the output of a power amplifier. The multiplexer 31 is configured to separate the multiband radio frequency signal 32 into at least first and second frequency band signals.

A first load modulator circuit $33_1$ is provided in a first branch, the first load modulator circuit $33_1$ coupled to receive the first frequency band signal, and configured to load modulate the first frequency band signal. A second load modulator circuit $33_2$ is provided in a second branch, the second load modulator circuit $33_1$ being coupled to receive the second frequency band signal, and configured to load modulate the second frequency band signal.

By providing separate load modulator circuits $33_1$, $33_2$ for each band, this makes it possible to load-modulate a power amplifier that outputs multiband signals with an arbitrarily large band separation. This also has the consequential advantage of enabling each load modulator circuit, per se, to be simplified (i.e. compared with a single load modulator circuit that would have to handle wide ranging frequency bands).

Furthermore, by providing separate load modulator circuits $33_1$, $33_2$ for each band, the first load modulator circuit $33_1$ and the second load modulator circuit $33_2$ can be controlled independently. In such an embodiment, the first load modulator circuit $33_1$ can be configured to have a first set of load modulation characteristics and the second load modulator circuit $33_2$ configured to have a second set of load modulation characteristics.

This has the advantage of enabling each load modulator circuit to be configured to best suit the requirements of the particular frequency band it is load modulating.

An example of a load modulation characteristic is a threshold value corresponding to a point at which load modulation is disabled (or enabled) for a particular frequency band signal, as will be described in greater detail later in the application. The threshold value can be set individually for each load modulation circuit $33_1$, $33_2$. As such each load modulation circuit $33_1$, $33_2$ can have its own threshold value, which can be the same or different to the threshold value of another load modulation circuit relating to a different frequency band in a multiband signal.

This has the advantage of enabling a different threshold value to be set in each load modulation circuit $33_1$, $33_2$, which means that efficiency can be increased even when different shunt losses are experienced in different frequency bands.

During use, the first and second load modulator circuits $33_1$, $33_2$ will operate within a particular voltage headroom (which may be fixed, or one of a number of variable voltage levels operated during different modes of operation). During operation at a particular voltage, according to one embodiment the whole or part of unused voltage headroom in the first load modulator circuit can be used by the second load modulator circuit, or vice versa. This has the advantage that, any unused voltage space in a high-loss band can be used to allow more load modulation in a low-loss band.

The load for the different bands, for example the first and second bands described above, can each be modulated as a function, for example the inverse square, of the sum of the envelope amplitudes of the individual bands (i.e. the magnitudes of their respective complex baseband signals). This provides improved efficiency for most types of power amplifiers, if load modulation is kept relatively close to the rule defined by this function.

This is because, for the usually larger, upper, part of the amplitude range, first and second bands are load modulated by essentially the same amount, which is a function of the sum of the magnitudes of the band signals.

By modulating in this way, the voltage room is shared between first and second bands based on their respective envelope amplitudes (for the "above threshold" region).

As will be described in greater detail in other embodiments below, the first and/or second load modulator circuit $33_1$, $33_2$ may comprise either a single varactor, or first and second varactors, for dynamically varying the load provided by the first and/or second load modulator circuit. It is noted, however, that other components for providing a variable load may be used within the scope of the invention as defined in the appended claims.

Figure 4:
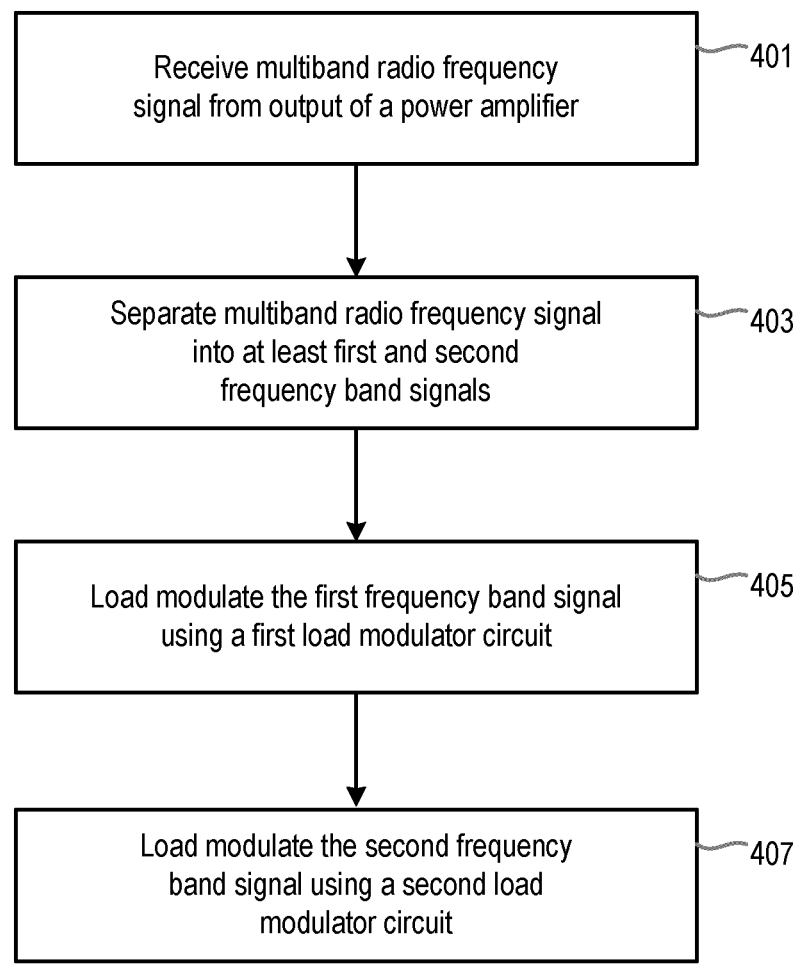
FIG. 4 shows the method steps performed by an embodiment of the invention.

FIG. 4 shows a method according to another embodiment of the invention, for load modulating a power amplifier that is configured to output a multiband radio frequency signal comprising at least a first frequency band and a second frequency band. The method comprises the step of receiving a multiband radio frequency signal from the output of a power amplifier, step 401. In step 403, the multiband radio frequency signal is separated into at least first and second frequency band signals. The first frequency band signal is load modulated using a first load modulator circuit, step 405, and the second frequency band load modulated using a second load modulator circuit, step 407.

According to one embodiment, the method further comprises the steps of controlling the first load modulator circuit and the second load modulator circuit independently. In such an embodiment the first load modulator circuit comprises a first set of load modulation characteristics and the second load modulator circuit comprises a second set of load modulation characteristics.

An example of a load modulation characteristic, as mentioned above, is a threshold value at which load modulation of a particular frequency band is disabled or enabled. The method can further comprise the steps of disabling or enabling load modulation in the first load modulation circuit at a first threshold value, and disabling or enabling load modulation in the second load modulation circuit at a second threshold value. The first threshold value may be different to the second threshold value. However, it is noted that a load modulation circuit could have the same threshold value as another load modulation circuit relating to a different frequency band in a multiband signal.

It is noted that a load modulation characteristic can be any other characteristic that causes the optimal RF current or RF voltage to differ between frequency bands. For example, the "on" resistance (Rds-on, i.e. resistance from drain to source while "on") of the devices causes a drop in the RF voltage swing capability. That is, the RF voltage swing drops at high output currents (i.e. towards peak power), usually by only a little amount, due to the "on" resistance of the devices. Since the load modulation tries to minimize RF current, while keeping the voltage swing as high as possible (above the threshold), and the Rdson is usually much smaller than the load even at peak output, the RF voltage swing for ideal load modulation with Rdson present drops parabolically (i.e.Vdd minus current squared times Rdson) towards peak output. If Rdson is different between the bands, the optimal load modulation characteristics also differ (i.e. the shape of the RF voltage limit curve, and hence the apparent load to modulate to). Series reactance has a similar effect as Rdson in this regard, and shunt reactance has a similar effect as shunt resistance. For this reason it is desirable to try to tune out these reactances (by absorbing them in the matching network) as perfectly as possible in each band of interest.

As mentioned above, the whole or part of unused voltage headroom in the first load modulator circuit can be used in the second load modulator circuit, or vice versa.

The method can comprise the steps of dynamically adjusting the load in the first and/or second load modulator circuit using either a single varactor, or first and second varactors.

For an upper range of output amplitudes, the apparent loads for the different bands are each modulated as a function (for example the inverse square) of the sum of the individual bands' envelope amplitudes (i.e. the magnitudes of their respective complex baseband signals). The modulation speed is therefore independent of the frequency separation between bands and therefore also independent of the total radio frequency bandwidth.

Figure 5:
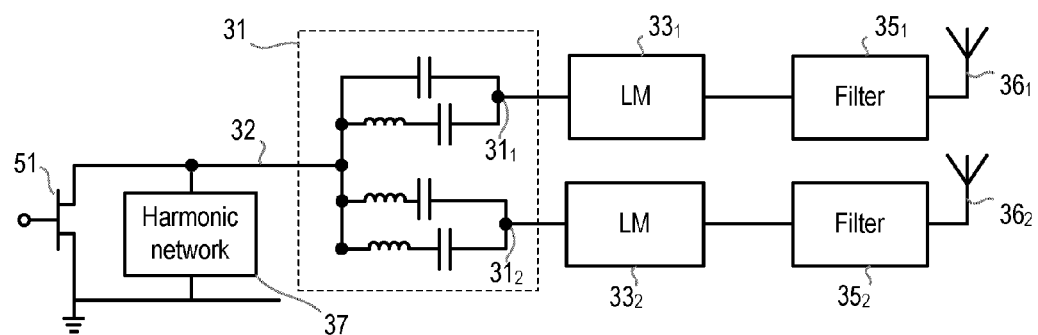
FIG. 5 shows an apparatus according to another embodiment of the invention.

FIG. 5 shows further details of an apparatus according to another embodiment of the invention, for load modulating a power amplifier (illustrated as transistor 51) that is configured to output a multiband radio frequency signal comprising at least a first frequency band and a second frequency band. The apparatus comprises a multiplexer 31 that is coupled to receive a multiband radio frequency signal 32 from the output of a power amplifier 51. The multiplexer 31 is configured to separate the multiband radio frequency signal 32 into at least first and second frequency band signals.

A first load modulator circuit $33_1$ is provided in a first branch, the first load modulator circuit $33_1$ coupled to receive the first frequency band signal, and configured to load modulate the first frequency band signal. A second load modulator circuit $33_2$ is provided in a second branch, the second load modulator circuit $33_1$ being coupled to receive the second frequency band signal, and configured to load modulate the second frequency band signal.

Since only two frequency bands are shown for clarity, the multiplexer 31 of this particular example can also be termed a diplexer. The multiplexer is configured using inductors and capacitors. However, it is noted that the multiplexer 31 may also be configured using transmission lines and other technologies. In the example of FIG. 5 each branch $31_1$, $31_2$ of the multiplexer 31 comprises a series resonance in one frequency band and a parallel resonance in the alternative frequency band. For example, the branch $31_1$ can have a series resonance in the first radio frequency band, the first frequency band being load modulated by the first load modulation circuit $33_1$, such that the first load modulation circuit $33_1$ is connected to the output of the transistor 51 via the low impedance of the series resonance in the first branch $31_1$. Contrarily, the first branch $31_1$ has a parallel resonance in the second radio frequency band, thus blocking the second radio frequency band from being modulated by the first load modulator circuit $33_1$. The same applies, conversely, for the second branch $31_2$ and the second load modulator circuit $33_2$. It is noted that the diplexer shown in the embodiment of FIG. 5 also incorporates DC blocking, although this is not an essential element of this embodiment or other embodiments. As will be appreciated by a person skilled in the art, DC blocking can be provided after an amplifier in view of the fact that the RF voltage at the transistor swings around the supply voltage and the output should instead be DC-free. However, the DC blocking can be placed quite far from the power amplifier, and it does not have to be realised by dedicated components. For example, it can be realised by a series resonator in a filter that is already provided. There are other reasons why DC blocking may be provided, for example the behaviour of the DC supply (unintended low frequency resonances) which can be disadvantageous if the two power amplifiers are connected at DC and baseband.

From the above it can be seen that the multiplexer 31 in the embodiment of FIG. 5 comprises, in a first branch, a series resonance circuit in the first frequency band and a parallel resonance circuit in the second frequency band, for providing a low impedance for the first frequency band signal and a high impedance for the second frequency band signal, between the output of a power amplifier and the first load modulator circuit. The multiplexer 31 also comprises, in a second branch, a series resonance circuit in the second frequency band and a parallel resonance circuit in the first frequency band, for providing a low impedance for the second frequency band signal and a high impedance for the first frequency band signal, between the output of a power amplifier and the second load modulator circuit.

The series resonance provides a low impedance, thereby allowing the desired frequency band to be load modulated, whereas the parallel resonance provides a high impedance for blocking the other frequency band from being load modulated.

During operation, the first frequency band signal is therefore extracted from the received multiband signal using a series resonance circuit in the first frequency band and a parallel resonance circuit in the second frequency band, for coupling the output of the power amplifier 51 to the first load modulator circuit $33_1$, with the second frequency band signal being extracted from the received multiband signal using a series resonance circuit in the second frequency band and a parallel resonance circuit in the first frequency band, for coupling the output of the power amplifier 51 to the second load modulator circuit $33_2$.

A harmonic network 37 may be provided for terminating or supporting harmonic voltages output from the power amplifier 51, for example shaping the voltage waves at the output of the power amplifier 51. The harmonic network 37 is coupled to the input of the multiplexer 31, and adapted to shape the voltage waveforms received from the power amplifier 51 prior to being processed by the multiplexer. The harmonic impedances of the harmonic network 37 shape the waveforms, which is desirable in order to obtain high efficiency. The reason for this is that the current pulses should be output when the drain voltage is as low as possible, and by shaping the drain voltage by including or removing specific harmonics, this low voltage part of the drain voltage waveform can be made wider. For example, if we have a very low impedance at all higher harmonics, the only voltage waveform that can exist is a sinewave. This harmonic termination is used in class B and AB. This is moderately efficient. If a high impedance is added to this at the third harmonic (and possibly more odd harmonics), a square voltage waveform can be supported. This waveform has a flat and wide low voltage part, which means that ideally the whole current pulse can be output with very low voltage drop, i.e. very low loss. The current in the drain node then needs to contain some small amount of third harmonic to create the third harmonic voltage, which can be achieved automatically by compression of the drain current pulses, when the (negative) voltage peaks reach the area where current decreases ("triode region", saturation). Otherwise, the third harmonic can be generated directly by having some third harmonic component in the gate drive voltage.

The embodiment of FIG. 5 makes use of different antennas $36_1$, $36_2$ for the different radio frequency bands. First and second filter circuits $35_1$, $35_2$ may be provided for filtering the output of each load modulation circuit $33_1$, $33_2$. The filter circuits $35_1$, $35_2$ may be configured to filter away low power noise and distortion outside of the supported transmission bands. In the dual-band (or multiband) case, there may be other distortion components which may change the requirements of the filter circuits.

As such, first and second filter circuits $35_1$, $35_2$ are coupled to the output of the first and second load modulator circuits $33_1$, $33_2$, respectively, for filtering the first frequency band signal and second frequency band signal prior to coupling to first and second antennas $36_1$, $36_2$.

Figure 6:
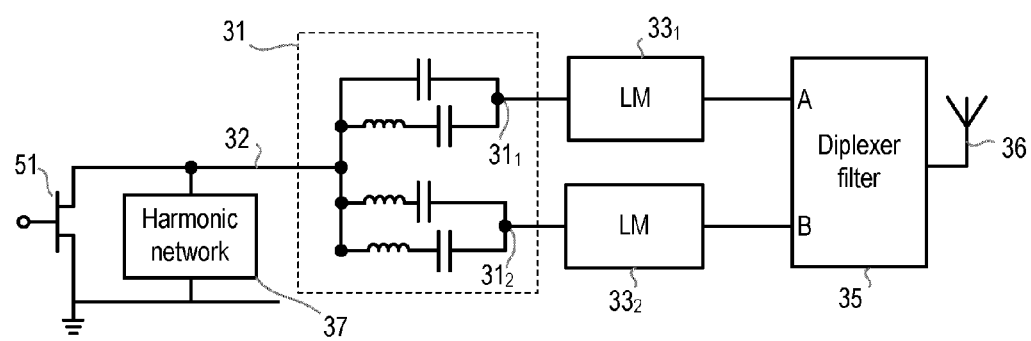
FIG. 6 shows an apparatus according to another embodiment of the invention.

FIG. 6 shows an alternative embodiment. In a similar manner to FIG. 5 the apparatus comprises a multiplexer 31 and first and second load modulation circuits $33_1$, $33_2$. However, the embodiment of FIG. 6 is for use with a single dual-band antenna 36. A diplexer filter 35 is provided in the embodiment of FIG. 6 for diplexing the first and second load modulated radio frequency signals to a common output, for coupling to the single dual-band antenna 36. As such, a diplex filter circuit 35 is coupled to the output of the first and second load modulator circuits $33_1$, $33_2$, for filtering the first frequency band signal and second frequency band signal prior to coupling to a dual-band antenna 36. The embodiment of FIG. 6, having a single antenna for both bands, has advantages over the embodiment of FIG. 5 which comprises different antennas for different bands. Having said that, however, the single antenna (assembly) might actually have different inputs for the different bands (in the case where the antenna patches are fed from different points anyway at the different frequencies), in which case FIG. 5 is more representative even for a "single antenna" case. Making or designing dual-band antennas (which is presently more difficult than making single band antennas) might not be justified in all applications, in which case the separate antennas for the different bands can be used, and be more efficient in such circumstances.

Further details will now be provided of load modulation circuits that may be used according to embodiments of the invention, for example using one or two varactors.

Figure 7:
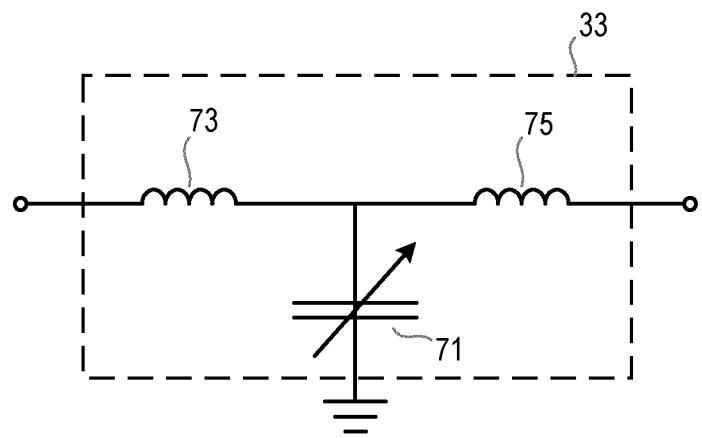
FIG. 7 shows an example of an embodiment of a load modulation circuit, for use in the embodiments of FIG. 3, 5 or 6.

FIG. 7 shows an example of a load modulation circuit 33 comprising a varactor 71 for load modulating the output of a power amplifier, the varactor 71 having first and second inductors 73, 75 coupled to the input and output, respectively, of the load modulation circuit.

Figure 8:
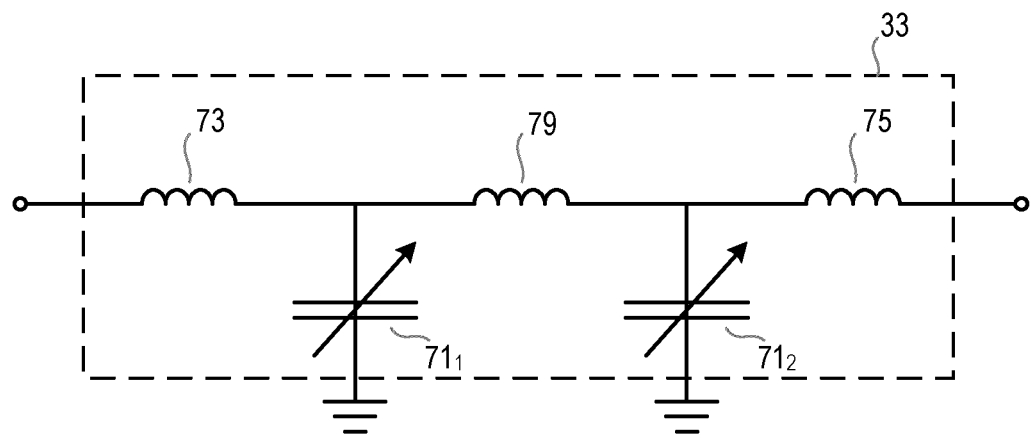
FIG. 8 shows another example of an embodiment of a load modulation circuit, for use in the embodiments of FIG. 3, 5 or 6.

FIG. 8 shows an example of a load modulation circuit 33 comprising first and second varactors $71_1$ and $71_2$ for load modulating the output of a power amplifier, with first and second inductors 73, 75 coupled to the input and output, respectively, of the load modulation circuit, and an inductor 79 coupled between the first and second varactors $71_1$, $71_2$. It will be appreciated by a person skilled in the art that the matching networks need to have a certain bandwidth (corresponding to the RF bands to be transmitted) and a certain transforming ability (effectively equivalent to the characteristic impedance of a quarterwave line impedance transformer). Thus, the circuits need to have sufficient components to be able to do this, which may of course be different from application to application. In the examples the electrically variable matching networks use varactors, and controlling such varactors is easier if they are in shunt (one terminal at a relative to the RF slowly variable voltage) instead of floating in the series branches (with RF voltage at both terminals). This is why the example networks are low pass—so they have inductors in the series branches and capacitors (varactors) in the shunt branches. It is noted that variable reactances controlled by other means (for example magnetic field, light, mechanical) could possibly be placed in the series branches too. The "T" configuration with inductors at both sides is more versatile in terms of matching capability, and an extra fixed inductor does not increase cost or complexity significantly. It is noted, however, that in many applications a "L" network configuration could also be sufficient. Bandpass varieties of the matching networks are also possible, for example with inductors in parallel with the varactors. It is noted that other possibilities for realising such circuits, as will be familiar to a person skilled in the art, are intended to be embraced by embodiments of the invention.

Figure 9A:
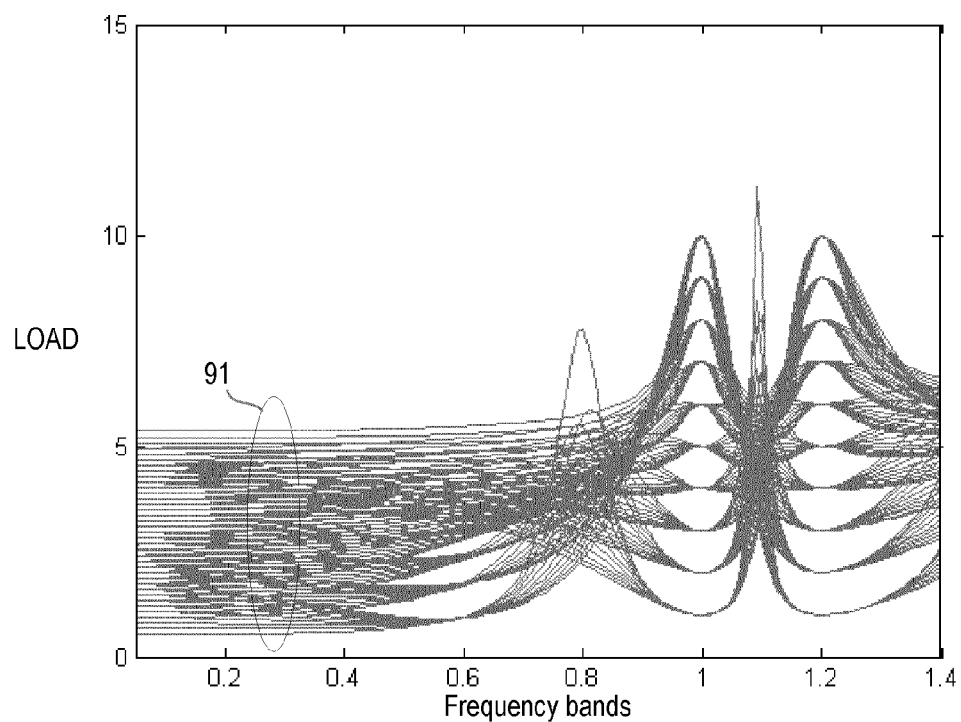
FIGS. 9a and 9b show the behaviour of a simple diplexer with respect to modulation of loads.
Figure 9B:
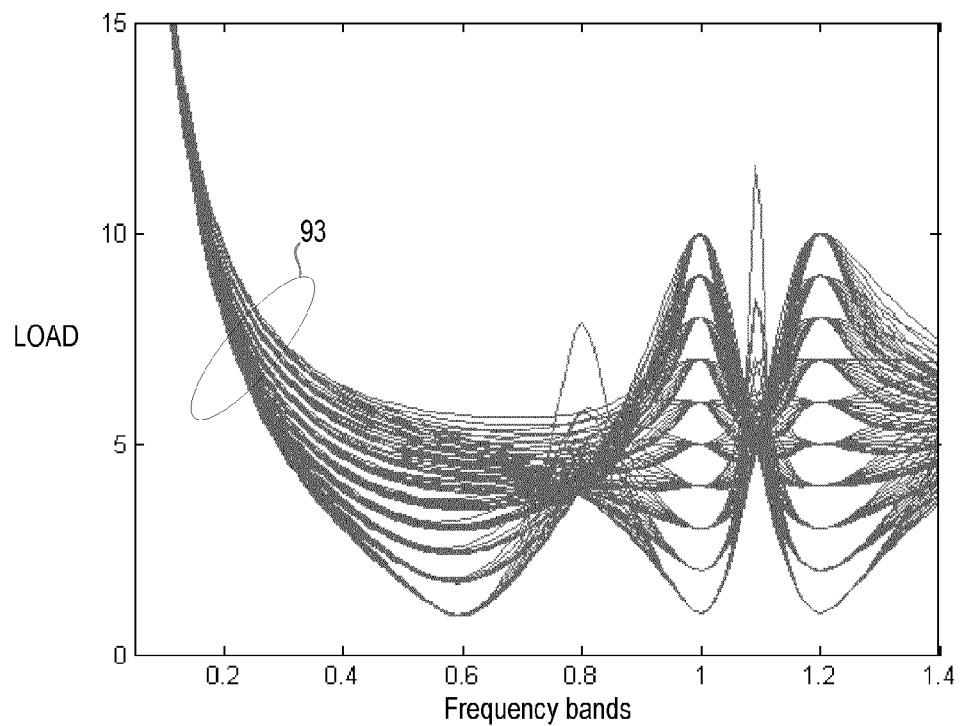

FIGS. 9a and 9b illustrate the behaviour of a simple diplexer (series/parallel resonators from two modulated loads to the drain of the power amplifier transistor 51) with respect to modulation of the loads. The load in a first branch having a frequency band "1.2" is modulated from 1 to 10 ohms in 1 ohm steps, for example, as is the load a second branch having a frequency band "1.0". Various combinations of loads are shown in FIGS. 9a and 9b, and it is noted that the two bands corresponding to 1.2 and 1.0 can be load-modulated independently. The curves 91 of FIG. 9a denote resistance at the drain node, while the curves 93 in FIG. 9b denote impedance magnitudes (including reactance).

Since different load modulation schemes are provided for different radio frequency bands, it is noted that different modulation schemes can be used for one or more of the frequency bands.

According to one embodiment the simplest modulation scheme uses the same voltage transformation ratio for the different bands. This transformation ratio is inversely proportional to the sum of the envelope amplitudes of the output voltages at the different bands. In this way, the voltage space is divided according to envelope amplitude. The RF currents for the different bands are reduced accordingly; from approximately linear, to somewhere between linear and quadratic with output amplitude, depending on the envelope amplitudes of the signals in the other bands. The load resistance is transformed by the square of this transformation, as stated above.

Since the RF output current is reduced due to the load modulation, the drive signal to the transistor of a power amplifier can also be reduced similarly in order to reduce driver power.

Using the sum of envelope amplitudes in controlling the load modulation means that the modulation bandwidth capabilities of the different load modulators needs only to be as large as the bandwidth of the envelope magnitude of the widest of the bands. It will be appreciated that this is of course always less than the bandwidth of the envelope magnitude of the total output signal, which is used in conventional load modulation. It is noted that the actual bandwidth used can also be reduced with minimal impact on efficiency by using techniques described in patent applications WO 2006/068555 A1, WO 2006/068553 A1 and WO 2006/068554 A1 by the present Applicant, preferably with the same bandwidth on all bands' envelope magnitude signals. This is possibly simple for one-stage transformation, wherein only one modulation-controlling signal (voltage) is needed. Controlling one-stage transformers is relatively straight forward in that only one relatively simple signal needs to be generated (with the rather complex methods of the above mentioned patent applications). The characteristic impedance of the single transforming section has a simple square root relation to the apparent (i.e. transformed) load. Since the apparent load has an inverse quadratic relationship to the envelope amplitude, the characteristic impedance of the transforming section has an inverse (linear) relation to the envelope amplitude. Thus the range is limited (the load modulation should not go all the way down to zero) and there is only one voltage (if the two load modulators for the different bands can be made similar enough). In such an embodiment both the first load modulator circuit and the second load modulator circuit are controlled with a single control voltage. Such an embodiment is suitable where the first and second load modulators are capable of being matched. If matching is not possible, then the first load modulator circuit and the second load modulator circuit can be controlled with first and second control voltages, as described elsewhere in the application.

For multi-stage transformation more control voltages need to be generated, and some will have both less variation (the section(s) closest to the load) and some will have more variation (the section(s) closest to the power amplifier). The section closest to the power amplifier for a many-stage transformer will have almost the full quadratic variation of the apparent load.

If the transistors found in power amplifiers and other circuitry have very low losses, this voltage transformation can be applied throughout the entire output range, i.e. down to zero output amplitude.

Figure 10A:
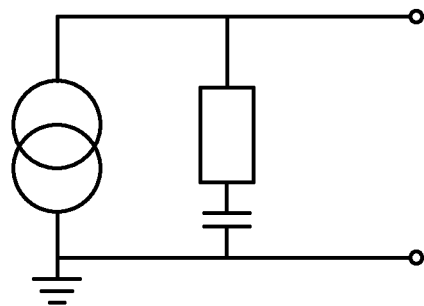
FIG. 10a shows an example of a lossy capacitance in a shunt path at the output of a power amplifier.
Figure 10B:
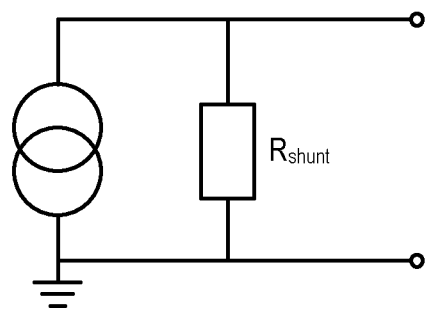

However, most transistors have losses due to finite resistance in shunt (parallel) at the output (drain) node. This can be caused for example by a lossy capacitance to ground at the drain of the transistor, or by RF conduction through a resistive substrate. FIG. 10a shows a lossy capacitance in a shunt path at the output, while FIG. 10b shows the equivalent parallel resistance $R_{SHUNT}$ due to such a lossy capacitance. The power lost in this resistance $R_{SHUNT}$ is proportional to the RF voltage squared. Since the average RF voltage is increased in load modulation power amplifiers, the impact of this type of loss is also increased.

For transistors with significant losses due to finite shunt resistance at the output node the load modulation applied by the load modulation circuits should preferably not follow the composite envelope all the way down to zero. Instead, the apparent load should rather be held constant below the point where the modulated load is equal to the equivalent shunt resistance $R_{SHUNT}$ (and held at that value).

For widely separated bands, the shunt losses will probably be different in the different frequency bands. This makes the points where load modulation should cease or be disabled (as described above in FIGS. 3 and 4) be different for the different frequency bands. Having individual lower end points of modulation for the individual bands increases efficiency in this case.

FIGS. 11a to 11f illustrate the voltage and current relationships in a dual-band load modulation amplifier. In this example the upper frequency band is at twice the frequency of the lower frequency band. The shunt loss due to the lossy output (drain to source/ground) capacitor will then be four times as high at the upper frequency. This is modelled with shunt resistors of 20 and 5 times the optimal load resistance for full output (Ropt), illustrating practical behaviour of laterally diffused metal oxide semiconductor (LDMOS) at 1.5 and 3 GHz.

It can be seen that the different bands are load modulated above different output voltage points. The first band (voltage v1) is modulated above 0.22 of maximum output and its load resistance held constant below. The second band (voltage v2) is modulated only above 0.45 of maximum output and its load resistance held constant below. Since the load resistance is held constant below a certain amplitude, the voltage is not forced towards the maximum voltage. The maximum desired voltage is instead the one that corresponds to the maximum allowed load resistance (with fixed transformation) for the specific band. Since the other band's voltage will steal a part of the voltage, even this lower voltage limit is only seldom reached, but more importantly; it is never exceeded (but in practice, the rules need not be followed strictly). This is seen in the different "limiting slopes" from the left in FIGS. 11c (slopes to a desired maximum voltage at 0.22) and 11e (slopes to a desired maximum voltage at 0.45).

Figure 1:
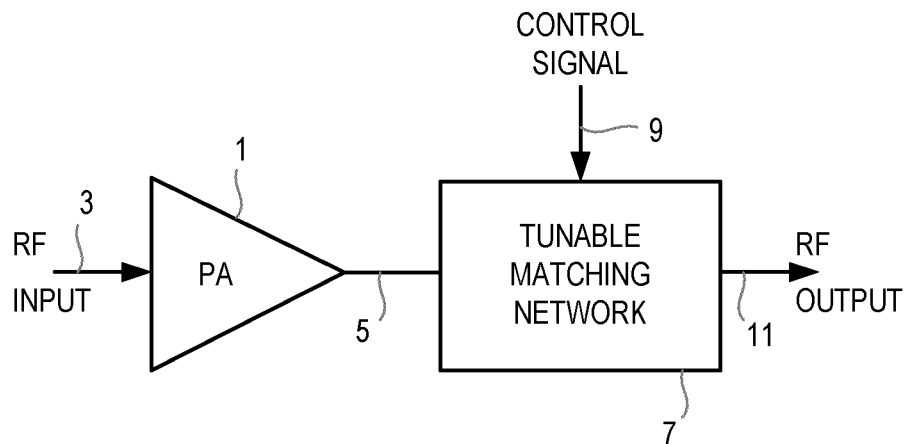
FIG. 1 shows a conventional load modulation circuit for load modulating multiband radio frequency signals.
Figure 2A:
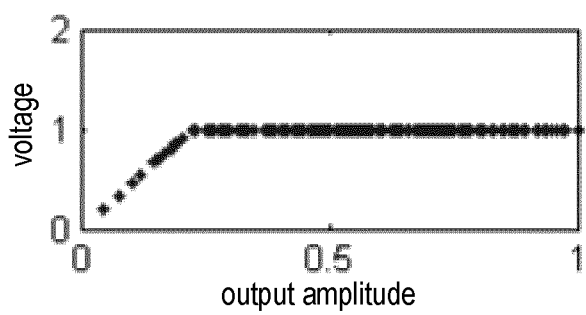
FIGS. 2a and 2b show voltage and current waveforms relative to output amplitude for a conventional circuit.
Figure 2B:
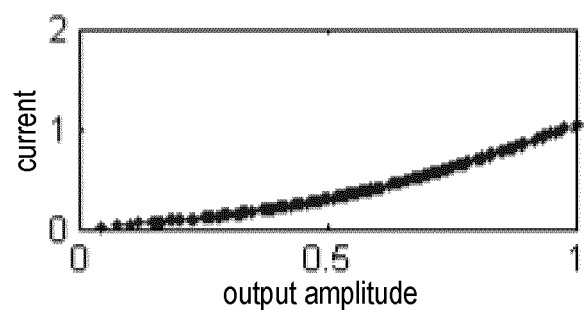

This can be compared with FIG. 2a. In the current plots 11d and 11f, the same is seen as a limiting slope from below, i.e. the current is not allowed to go below a linear slope determined by the maximum allowed load resistance (with fixed transformation). This is more difficult to see since the difference is between the parabolical "ideal" which has a zero slope at zero, and the actual curve, which slopes at a fixed angle already from zero.

These values are provided as examples only, and other threshold voltages can be used for disabling the point at which dynamic load modulation varies the load presented to the output of the power amplifier, and instead presents a constant load below that point.

If the losses in the different frequency bands are different, a further (relative) efficiency increase can be obtained by not only holding the loads constant below their individual set points, but using the thus unused voltage space from a high-loss band to allow more load modulation in a low-loss band. This corresponds to the references made above to a voltage headroom from one frequency band being used for another frequency band, and vice versa.

Figure 12A:
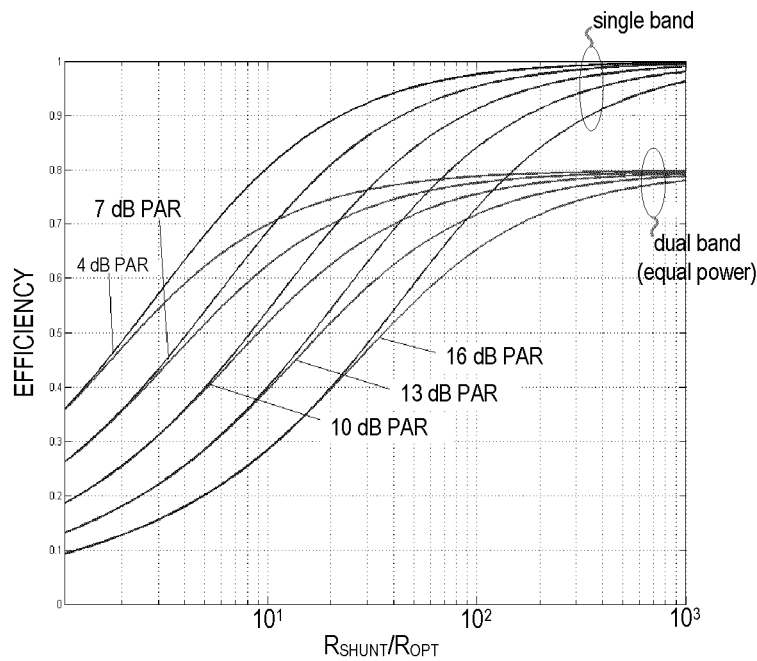
FIG. 12a shows the efficiency of dual band load modulation power amplifiers for signals of different peak to average ratio (PAR) for different amounts of shunt loss.

The efficiency of dual-band load modulation power amplifiers for signals of different peak to average ratio (PAR) for different amounts of shunt loss is shown in FIG. 12a. The two bands have equal output power and the shunt loss is the same in both bands. The corresponding single-band efficiencies are shown for reference.

Figure 12B:
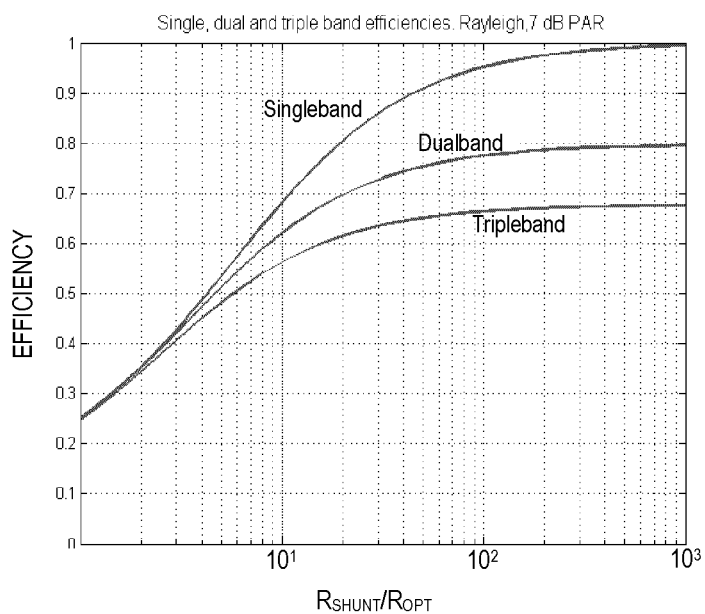
FIG. 12b shows dual and triple band efficiency for 7 dB PAR.

FIG. 12b shows dual-band and triple-band efficiency for 7 dB PAR.

Figure 13:
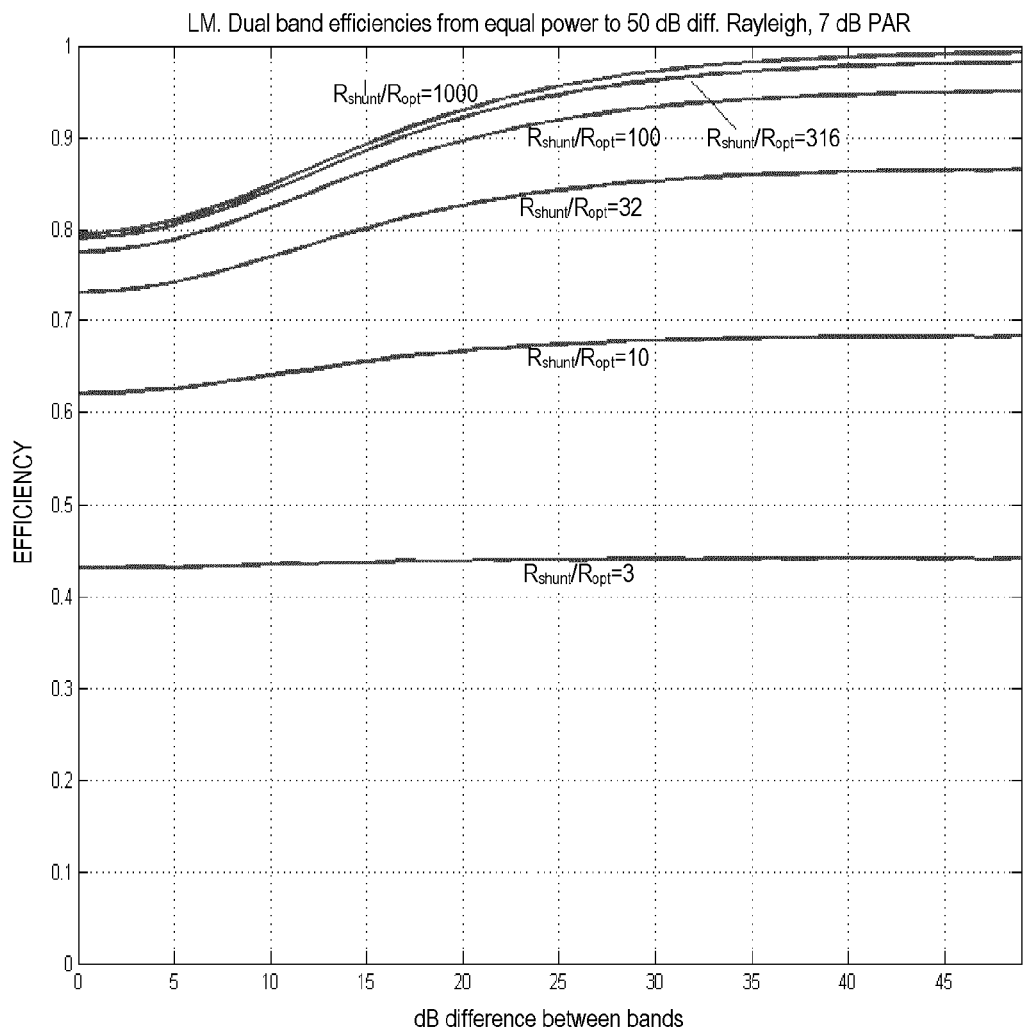
FIG. 13 shows the efficiency as a function of power difference in the dual band case, for 7 dB PAR and various loss figures.

In the case where there is a power difference between the signals in the different bands, the efficiency is higher than for the equal power case shown above. The efficiency as a function of power difference in the dual-band case is shown, for 7 dB PAR and various loss figures, in FIG. 13.

The embodiments of the invention make it possible to dynamically load-modulate a power amplifier with multi-band signals with arbitrarily large band separation. The invention simplifies construction of the load modulator and greatly reduces the severe problems associated with wide bandwidth load modulators and modulation. Having individual modulation characteristics in the different bands minimizes the impact of frequency dependent shunt loss at the transistor output.

The embodiments of the invention make it possible to dynamically load-modulate a power amplifier outputting a multiband signal, increasing efficiency without the problems described in the background section. This is enabled by using separate load modulators for the different bands, for example connected to the transistor(s) output via a multiplexer (such as a diplexer in the dualband case).

Some embodiments can be configured to give higher efficiency with lossy transistors, especially transistors whose loss is different in the different RF bands of interest.

Figure 14:
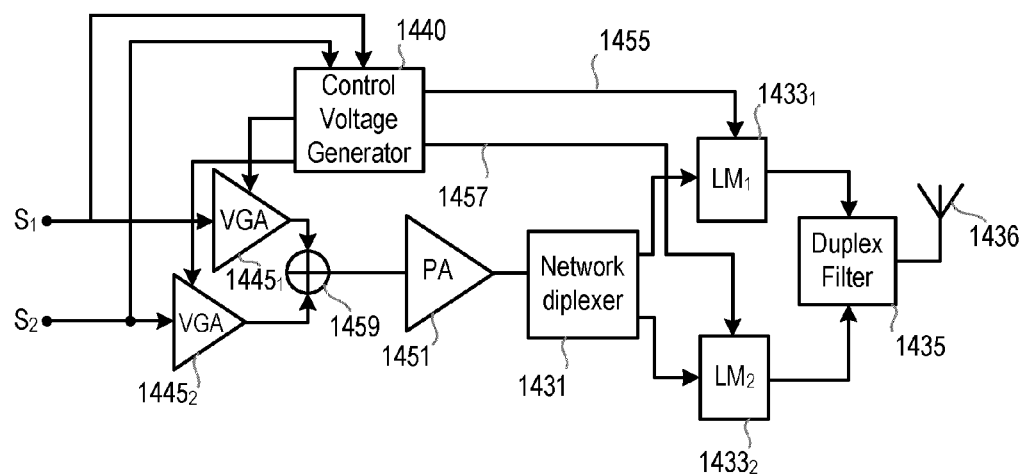
FIG. 14 shows an example of how embodiments of the invention may be used in a typical application.

FIG. 14 shows an example of how embodiments of the invention may be used in a typical application. A power amplifier 1451 is coupled receive a multiband input signal comprising at least first and second frequency band signals (the multiband signal being formed, for example, by first and second variable gain amplifiers $1445_1$ and $1445_2$ and an adder circuit 1459). The output of the power amplifier 1451, being an amplified version of the multiband radio frequency signal comprising at least first and second frequency bands, is coupled to a network diplexer 1431 (i.e. in the example of a dual band system), which separates the output of the power amplifier 1451 into first and second frequency band signals.

A first load modulator circuit $1433_1$ is provided in a first branch, the first load modulator circuit $1433_1$ coupled to receive the first frequency band signal, and configured to load modulate the first frequency band signal. A second load modulator circuit $1433_2$ is provided in a second branch, the second load modulator circuit $1433_1$ being coupled to receive the second frequency band signal, and configured to load modulate the second frequency band signal.

The outputs of the first load modulator circuit $1433_1$ and second load modulator circuit $1433_2$ are coupled to a diplex filter 1435, for example, which feeds a dual-band antenna 1436.

A control voltage generator 1440 is provided for generating first and second control voltages 1455 and 1457 for the first load modulator circuit $1433_1$ and second load modulator circuit $1433_2$, respectively. The first and second control voltages 1455 and 1457 are generated with the thresholds mentioned in the embodiments above in mind. The control voltage generator 1440 comprises envelope detectors for determining the envelope voltages of the first frequency band signal $S_1$ and the second frequency band signal $S_2$. In one embodiment, where there is equal series resistance in each of the frequency bands, the envelope voltages are added for use by the control voltage generator 1440. However, in a scenario whereby different series resistances exist in the different frequency bands, then the envelope voltages can be weighted differently before addition, and before use by the control voltage generator 1440.

In a single band load modulator circuit according to the prior art, the envelope of the signal would be used to control the drive level and apparent load. If the envelope of the full multiband signal were used in this fashion, the control voltages would vary at too high a speed for a load modulator to handle (and also cause the other problems outlined above). Therefore, FIG. 14 differs in that, while multiple instances of envelope extractors, VGAs, load modulators etc., are required, the control voltage generator 1440 is configured to behave differently since only a single power amplifier 1451 is provided. In particular, a single control voltage generator 1440 controls all VGAs approximately equal and all load modulator blocks approximately equal (except for when having different thresholds, etc., as mentioned above), with the control voltage generator 1440 doing this while mainly using the sum-of-envelope voltages.

The first load modulator circuit $1433_1$ and the second load modulator circuit $1433_2$ are therefore configured to operate such that the load for the first and second radio frequency bands are each modulated as a function of the sum of the envelope amplitudes of the individual first and second radio frequency bands.

By providing separate load modulator circuits $1433_1$, $1433_2$ for each band, this makes it possible to load-modulate a power amplifier that outputs multiband signals with an arbitrarily large band separation. This also has the consequential advantage of enabling each load modulator circuit, per se, to be simplified (i.e. compared with a single load modulator circuit that would have to handle wide ranging frequency bands).

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single

The invention claimed is:

1. An apparatus for load modulating a power amplifier that is configured to output a multiband radio frequency signal comprising at least a first frequency band and a second frequency band, the apparatus comprising:
   a multiplexer coupled to receive a multiband radio frequency signal from the output of the power amplifier, and configured to separate the multiband radio frequency signal into at least first and second frequency band signals;
   a first load modulator circuit provided in a first branch, the first load modulator circuit coupled to receive the first frequency band signal, and configured to load modulate the first frequency band signal; and
   a second load modulator circuit provided in a second branch, the second load modulator circuit coupled to receive the second frequency band signal, and configured to load modulate the second frequency band signal,
   wherein a load modulation characteristic comprises a threshold value corresponding to a point at which load modulation is disabled or enabled, and wherein the threshold value is individually set in each load modulation circuit.

2. The apparatus of claim 1, wherein the first load modulator circuit and the second load modulator circuit are configured to be controlled independently, the first load modulator circuit being configured to operate according to a first set of load modulation characteristics and the second load modulator circuit being configured to operate according to a second set of load modulation characteristics.

3. The apparatus of claim 2 wherein, the first and second load modulator circuits are configured to operate so that, during operation, the whole or part of unused voltage headroom in the first load modulator circuit is used by the second load modulator circuit, or vice versa.

4. The apparatus of claim 1, wherein the first load modulator circuit and the second load modulator circuit are configured to operate such that the load for the first and second radio frequency bands are each modulated as a function of the sum of the envelope amplitudes of the individual first and second radio frequency bands.

5. The apparatus of claim 1, wherein at least one of the first and second load modulator circuits comprises either a single varactor, or first and second varactors, for dynamically varying the load provided by the at least one of the first and second load modulator circuits.

6. The apparatus of claim 1, wherein the multiplexer comprises:
   in the first branch, a series resonance circuit in the first frequency band and a parallel resonance circuit in the second frequency band, configured so as to provide a low impedance for the first frequency band signal and a high impedance for the second frequency band signal, between the output of the power amplifier and the first load modulator circuit; and
   in the second branch, a series resonance circuit in the second frequency band and a parallel resonance circuit in the first frequency band, configured so as to provide a low impedance for the second frequency band signal and a high impedance for the first frequency band signal, between the output of the power amplifier and the second load modulator circuit.

7. The apparatus of claim 1, further comprising a harmonic network coupled to an input of the multiplexer, the harmonic network being configured to shape voltage waveforms received from the power amplifier prior to being processed by the multiplexer.

8. The apparatus of claim 1, further comprising:
   first and second filter circuits coupled to the output of the first and second load modulator circuits, respectively, and configured to filter the first frequency band signal and second frequency band signal prior to coupling to first and second antennas; or
   a diplex filter circuit coupled to the output of the first and second load modulator circuits and configured to filter the first frequency band signal and second frequency band signal prior to coupling to a dual-band antenna.

9. A method for load modulating a power amplifier that is configured to output a multiband radio frequency signal comprising at least a first frequency band and a second frequency band, the method comprising the steps of:
   receiving a multiband radio frequency signal from the output of the power amplifier;
   separating the multiband radio frequency signal into at least first and second frequency band signals;
   load modulating the first frequency band signal using a first load modulator circuit;
   load modulating the second frequency band using a second load modulator circuit; and
   enabling or disabling load modulation in the first load modulation circuit at a first threshold value, and enabling or disabling load modulation in the second load modulation circuit at a second threshold value, wherein the first threshold value is different from the second threshold value.

10. The method of claim 9, further comprising the steps of controlling the first load modulator circuit and the second load modulator circuit independently, wherein the first load modulator circuit comprises a first set of load modulation characteristics and the second load modulator circuit comprises a second set of load modulation characteristics.

11. The method of claim 10, further comprising the steps of using the whole or part of unused voltage headroom in the first load modulator circuit in the second load modulator circuit, or vice versa.

12. The method of claim 9, further comprising the step of dynamically adjusting the load in at least one of the first and second load modulator circuits using either a single varactor, or first and second varactors.

13. The method of claim 9, further comprising the steps of:
   extracting the first frequency band signal from the received multiband signal using a series resonance circuit in the first frequency band and a parallel resonance circuit in the second frequency band, for coupling the output of the power amplifier to the first load modulator circuit; and
   extracting the second frequency band signal from the received multiband signal using a series resonance circuit in the second frequency band and a parallel resonance circuit in the first frequency band, for coupling the output of the power amplifier to the second load modulator circuit.

14. The method of claim 9, further comprising the steps of shaping the multiband radio frequency signal received from the power amplifier using a harmonic network, prior to separating the multiband radio frequency signal into first and second frequency band signals.

15. The method of claim 9, further comprising the steps of:
  filtering the first frequency band signal and second frequency band signal using first and second filter circuits, respectively, prior to coupling to first and second antennas; or
  filtering the first frequency band signal and second frequency band signal using a diplex filter circuit, prior to coupling to a dual-band antenna.

16. The method of claim 9, further comprising the step of controlling the first load modulator circuit and the second load modulator circuit with a single control voltage.

* * * * *